United States Patent
Chen et al.

(10) Patent No.: US 7,430,139 B2
(45) Date of Patent: Sep. 30, 2008

(54) SHARED MEMORY SYNCHRONIZATION SYSTEMS AND METHODS

(75) Inventors: Wen-Chung Chen, Cupertino, CA (US); Jianming Xu, San Jose, CA (US); Huizhong Ou, Orangevale, CA (US); Chienkang Cheng, Los Altos, CA (US); Shou-Yu Joyce Cheng, San Jose, CA (US)

(73) Assignee: Via Technologies, Inc., Hsin-Tien, Taipei (TW)

( * ) Notice: Subject to any disclaimer, the term of this patent is extended or adjusted under 35 U.S.C. 154(b) by 320 days.

(21) Appl. No.: 11/451,079

(22) Filed: Jun. 12, 2006

(65) Prior Publication Data

US 2007/0285996 A1   Dec. 13, 2007

(51) Int. Cl.
*G11C 7/06* (2006.01)

(52) U.S. Cl. .................. 365/189.07; 365/63; 365/233.1

(58) Field of Classification Search ............ 365/189.07, 365/63, 51, 233.1
See application file for complete search history.

(56) References Cited

U.S. PATENT DOCUMENTS 7,016,213 B2 *   3/2006   Reeves et al. .................. 365/63
7,020,757 B2 *   3/2006   Ruhovets et al. ............ 711/167

* cited by examiner

*Primary Examiner*—Anh Phung
*Assistant Examiner*—Toan Le
(74) *Attorney, Agent, or Firm*—Thomas, Kayden, Horstemeyer & Risley

(57) ABSTRACT

The present disclosure provides system and method embodiments for synchronizing access to memory between a plurality of modules in a pipelined system. One system embodiment, among others, includes an upstream module and a downstream module that each share one or more locations in memory. The upstream module is configured to receive a command pair having matched identifiers, one half (wait command) of which enables the upstream module to delay access to the memory to avoid read-after-write (RAW) hazard, the other half (signal command) which is passed to the downstream module. The downstream module passes the identifier from the signal command to the upstream module at a time corresponding to the downstream module reaching an idle state, thus ceasing access to the memory. The upstream module, upon determining that the identifier received over a direct connection from the downstream module is from the command pair, accesses the one or more locations in the memory.

27 Claims, 6 Drawing Sheets

US 7,430,139 B2

SHARED MEMORY SYNCHRONIZATION SYSTEMS AND METHODS

TECHNICAL FIELD

The present disclosure is generally related to data processing systems, and more particularly, is related to computer graphics systems and methods

BACKGROUND

Computer graphics is the art and science of generating pictures, images, or other graphical or pictorial information with a computer. Generation of the pictures or images is commonly called rendering. Generally, in three-dimensional (3D) computer graphics, geometry that represents surfaces (or volumes) of objects in a scene is translated into pixels (picture elements), stored in a frame buffer, and then displayed on a display device.

One challenge involves determining how to share a cache memory (herein, also referred to simply as a cache or memory). For instance, depth and/or texture processing can be determined at an application level by a central processing unit (CPU), at the front end of a graphics processor (e.g., by a vertex shader program generating texture type data maps), or can be implemented in a post-processing manner (e.g., by pixel shader generation of post image rendered in a frame buffer). In light of the varied locations of modules utilized for these and other types of processes, it is evident that access (either read or writes) to a cache can be shared. For instance, referring to the example data processing system 10 shown in FIG. 1, a controller 20 (e.g., software module) provides commands (or equivalently, instructions) to a pipeline comprising an upstream processing unit P1 12, an intermediary processing unit P2 14, and a downstream processing unit P3 16. Each unit, P1-P3, comprises one or more registers (not shown) that receive the respective command(s) for the individual unit while passing commands that have no relevance to the particular unit to the next unit. Both P1 12 and P3 16 share a cache 18, and either P1 12 or P3 16 can access data in the cache 18 when enabled or activated by a respective enable command received through the pipeline from the controller 20. In other words, access to the cache 18 is preferably implemented by one of the active processing units P1 12 or P3 16 in response to a command provided by the controller 20 to avoid read-after write (RAW) hazards.

Thus, in one implementation, the controller 20 (or driver software) may provide an enable command directed to P3 16, which passes from P1 12, through P2 14, to eventually enable P3 16. Similarly, the controller 20 may send a disable command to P1 12, which results in the de-activating or disabling of P1 12 currently in process. When this switching occurs from P1 12 to P3 16, since commands pass through the pipeline from P1 12 to P3 16, there is no risk of P3 16 not receiving any task after P1 12 is idle, and thus no synchronization mechanisms are needed. In other words, operations in P1 12 cease by the time P3 16 receives, through the pipeline, an enabling command in one of its registers (not shown). However, there is a risk that data stored in the cache 18 may be lost if switching occurs in the opposite direction (i.e., from P3 16 to P1 12), since P1 12 may receive an enabling command in one of its registers (not shown) from the controller 20 before a disabling command reaches P3 16 through the pipeline.

SUMMARY

Embodiments of the present disclosure provide systems and methods for synchronizing access to memory between a plurality of modules in a pipelined system. Briefly described, one embodiment of a method of synchronizing access to memory between an upstream module and a module located downstream in a pipelined system comprises receiving a wait command at the upstream module and a signal command at the downstream module, the wait command and the signal command each having an identifier, delaying access to the memory responsive to receiving the wait command, receiving an identifier from the downstream module, comparing the identifier received from the downstream module with the identifier corresponding to the wait command, and accessing the memory if the identifier corresponding to the wait command matches the identifier from the downstream module.

Another embodiment of a method of synchronizing access to memory between a downstream module and a module located upstream in a pipelined system comprises receiving a signal command at the downstream module, the signal command having an identifier, writing data to the memory until an idle state is reached, and responsive to the idle state, providing the identifier to the upstream module.

As indicated above, various system embodiments are described. One system embodiment that synchronizes access to memory between a plurality of modules in a pipelined system comprises an upstream module comprising a first register configured to receive a wait command having an identifier, and a first access logic configured to delay access to the memory responsive to the receiving the wait command at the first register, receive an identifier from a downstream module, compare the identifier received from the downstream module with the identifier corresponding to the wait command, and access the memory if the identifier corresponding to the wait command matches the identifier from the downstream module.

Another system embodiment that synchronizes access to memory between a plurality of modules in a pipelined system comprises a downstream module comprising a second register configured to receive a signal command having an identifier, and a second access logic configured to write data to the memory until an idle state is reached, and responsive to the idle state, provide the identifier to an upstream module.

Graphics processor embodiments are described. One such embodiment comprises an upstream module and a downstream module connected to the upstream module, the upstream module comprising a first register configured to receive a wait command having an identifier, and a first access logic configured to delay access to a memory responsive to receiving the wait command at the first register, receive an identifier from the downstream module, compare the identifier received from the downstream module with the identifier corresponding to the wait command, and access the memory if the identifier corresponding to the wait command matches the identifier from the downstream module. The downstream module comprises a second register configured to receive a signal command having an identifier, and a second access logic configured to write data to the memory until an idle state is reached, and responsive to the idle state, provide the identifier corresponding to the signal command to the upstream module.

Other systems, methods, features, and advantages of the present disclosure will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the disclosed systems and methods can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Figure 1:
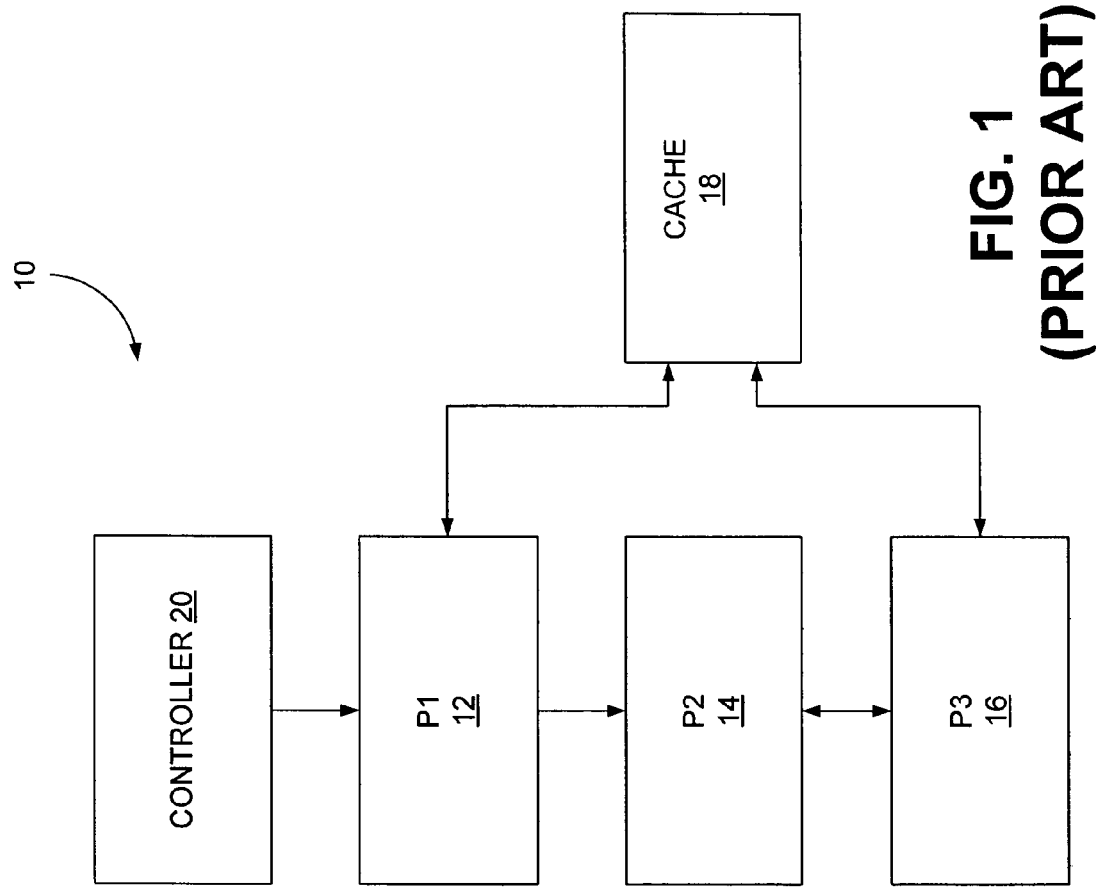
FIG. 1 is a block diagram of an exemplary pipeline system that illustrates a shared cache among processing units.

Disclosed herein are various embodiments of shared memory synchronization systems and methods (herein, synch systems for brevity). Such synch systems comprise multiple processing units or modules arranged in a pipelined manner, and that share access to a cache memory (herein, also referred to as simply a cache or memory). Synchronization of such access is implemented through paired wait/signal commands. For instance, consider two modules, with one module (herein, upstream module) located upstream in the pipeline relative to the other module (the latter herein referred to as a downstream module), and where control passes from the downstream module to the upstream module (and vice versa). Both modules share access to a cache, although access is only allowed by one module at a time. Upon a switch in control from the downstream module to the upstream module (i.e., the upstream module is activated by an enabling command and the downstream module is deactivated by a disabling command), the upstream module receives a command pair with matching identifiers. The command pair comprises a wait command and a signal command. The identifier(s) can be generated values (e.g., generated by a counter) that are incremented each time there is a switch in control from the downstream module to the upstream module. The wait command places the upstream module in a "wait" state. While in the wait state, the upstream module is disallowed access to a cache that is shared with the downstream module.

The signal command is passed along the pipeline to the downstream module and received in a register of the downstream module. In some embodiments, there may be intervening modules located between the upstream module and the downstream module. The downstream module completes its processing before becoming disabled by the disable command. Once disabled, the downstream module commences an idle state where no further access to the shared cache is performed until the downstream module receives an enabling command. Upon commencing the idle state, the downstream module provides the signal command identifier to the upstream module.

The upstream module compares the identifier corresponding to the wait command with the identifier received from the downstream module, and if there is a match, the upstream module commences access to the cache. That is, the upstream module performs a comparison of the wait command identifier with the identifier of the paired signal command, with the result that, if there is a match, the upstream module can access memory shared with the downstream module without risk or with little risk of read after write (RAW) hazard. Further, as compared to conventional approaches, synchronization is performed internally to each pipeline without any external assistance such as pipeline flushes or waiting for an external event.

Although described in the context of a graphics processor system, and in particular depth processing (Z) units that share a Z cache in a graphics processing unit, it will be appreciated that the scope of the preferred embodiments include other pipeline architectures where modules (e.g., fixed function units, programmable units, etc.) share access to the Z-cache, or other types of cache or memory.

Figure 2:
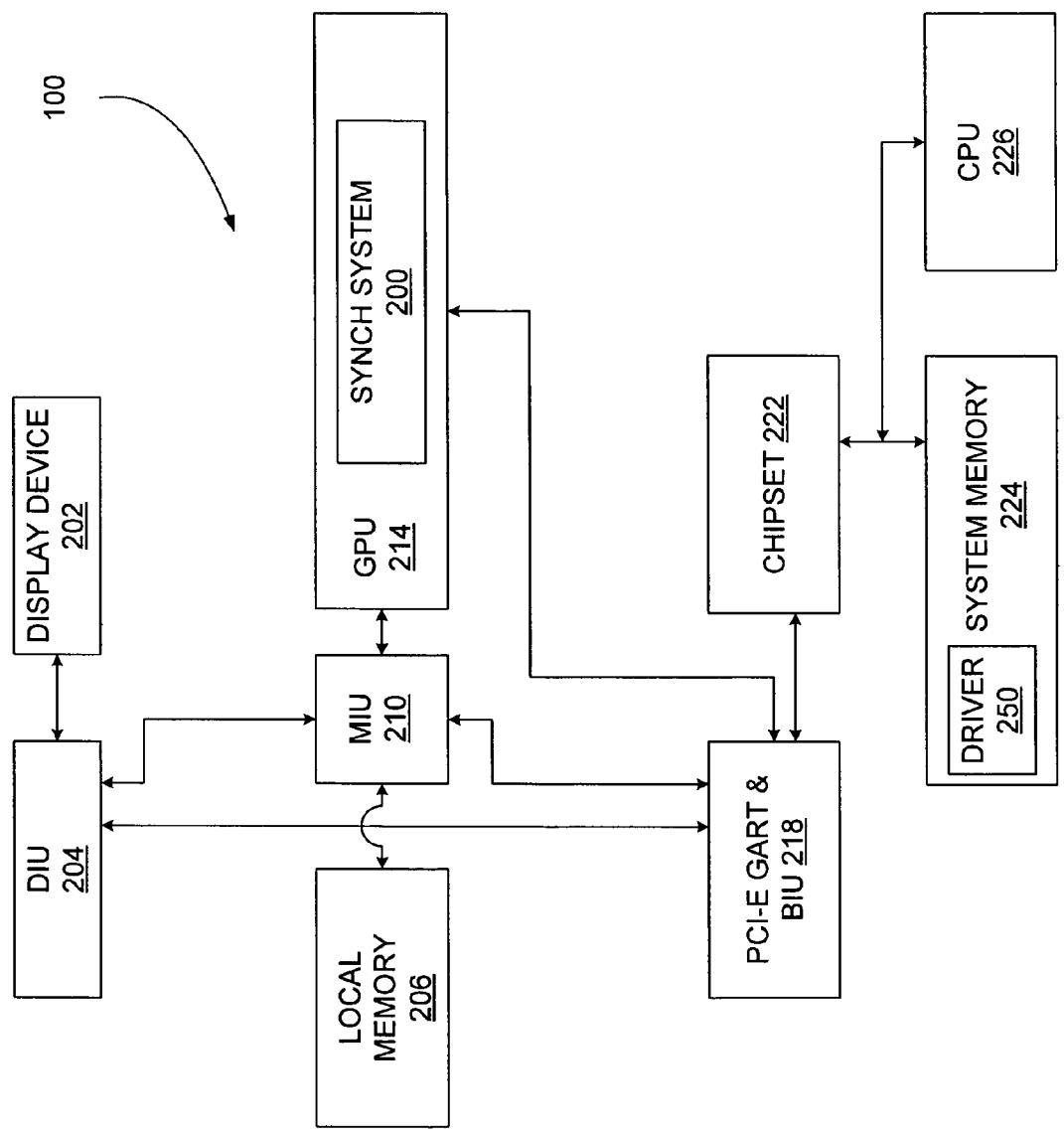
FIG. 2 is a block diagram an embodiment of a graphics processor system in which embodiments of shared memory synchronization systems and methods are implemented.

FIG. 2 is a block diagram of an embodiment of a graphics processor system 100 in which embodiments of shared memory synchronization systems and methods (herein, synch systems 200) are implemented. In some implementations, the graphics processor system 100 may be configured as a computer system. The graphics processor system 100 may comprise a display device 202 driven by a display interface unit (DIU) 204 and local memory 206 (e.g., which may comprise a display buffer, texture buffer, command buffer, etc.). Local memory 206 may also be referred to interchangeably herein as a frame buffer or storage unit. Local memory 206 is coupled to a graphics processing unit (GPU) 214 through a memory interface unit (MIU) 210. The MIU 210, GPU 214, and DIU 204 are coupled in one embodiment to a peripheral component interconnect express (PCIE) compatible bus interface unit (BIU) 218. Although the BIU 218 is shown using a graphics address remapping table (GART), other memory mapping mechanisms may be employed. The GPU 214 includes the synch system 200, as described below. Although shown as a component of the GPU 214, in some embodiments, the synch system 200 may include one or more additional components of the graphics processor system 100 that are shown, or different components.

The BIU 218 is coupled to a chipset 222 (e.g., north bridge chipset) or switch. The chipset 222 comprises interface electronics to strengthen signals from a central processing unit (CPU) 226 (also referred to herein as a host processor) and to separate signals to and from a system memory 224 from those signals going to and from input/output (I/O) devices (not shown). Although a PCIE bus protocol is described, other manners of connection and/or communication between the host processor and the GPU 214 may be implemented in some embodiments (e.g., PCI, proprietary high-speed bus, etc.). The system memory 224 also comprises driver software 250, which communicates instructions or commands through the use of the CPU 226 to registers in the GPU 214.

Additional graphics processing units may be employed in some embodiments, coupled for instance to the components shown in FIG. 2 through the chipset 222 via a PCIE bus protocol. In one embodiment, the graphics processor system 100 may embody all of the components shown in FIG. 2, or fewer and/or different components than those shown in FIG.

2. Further, in some embodiments, additional components may be used, such as a south bridge chipset coupled to the chipset 222.

The synch system 200 can be implemented in hardware, software, firmware, or a combination thereof. In the preferred embodiment(s), the synch system 200 is implemented in hardware, including any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

When implemented in software or firmware, such as driver software 250 controlling the hardware processing, such driver software 250 may comprise an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Figure 3:
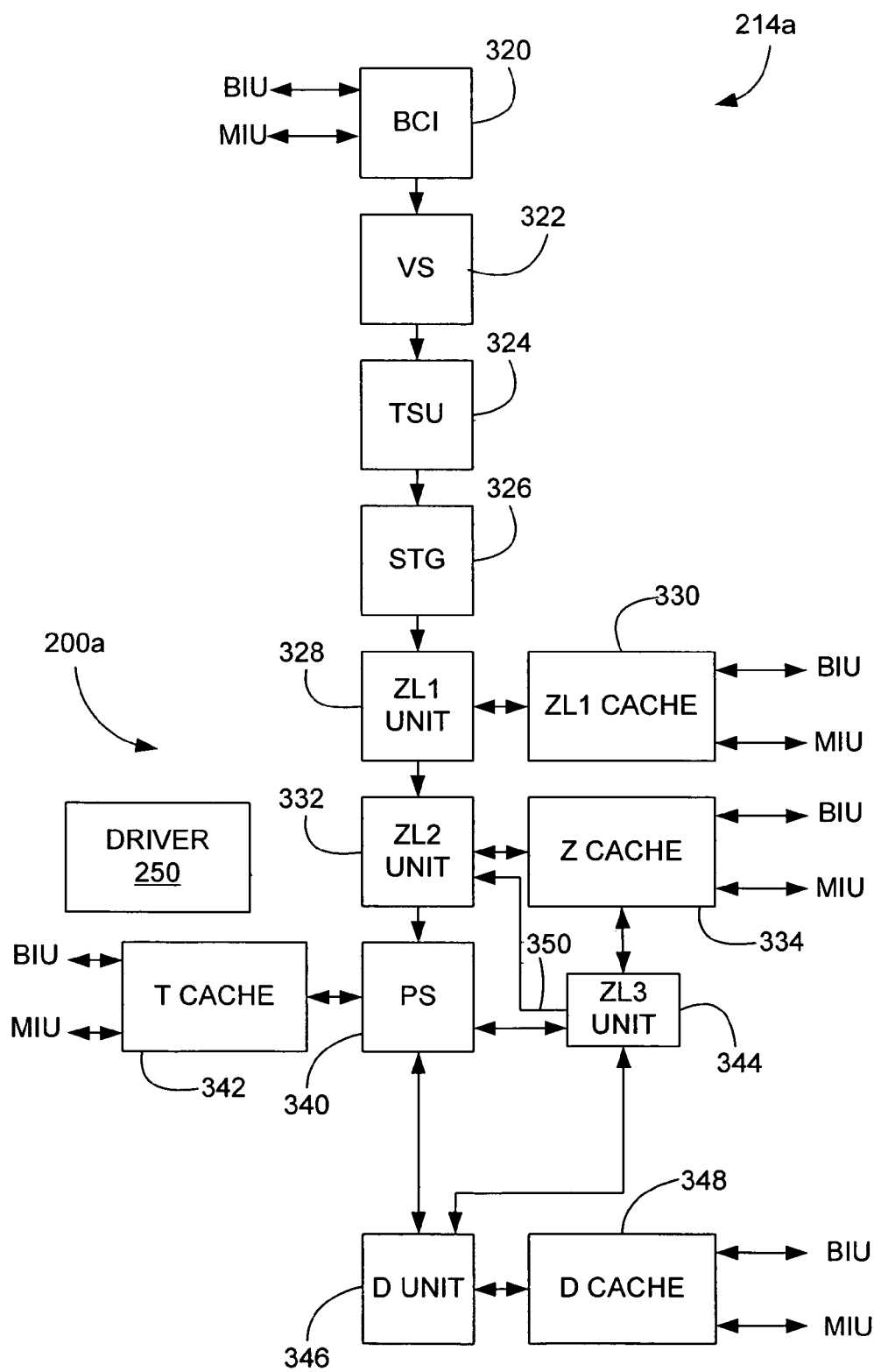
FIG. 3 is a block diagram that illustrates an embodiment of the graphics processing unit and the shared memory synchronization system shown in FIG. 2.

FIG. 3 is a block diagram that illustrates embodiments of the graphics processing unit 214a and synch system 200a shown in FIG. 2. Additional or fewer components to those shown in FIG. 3 may also be included in some embodiments. For instance, each module described below may have its own internal register or registers, not shown, used by a module co-located with the register or shared with different modules. The graphics processing unit 214a includes a buffer control initialization (BCI) unit 320, vertex shader (VS) 322, triangle setup unit (TSU) 324, span and tile generation (STG) unit 326, ZL1 unit 328 (which is a hierarchical Z unit), ZL1 cache 330, and pixel level Z units comprising ZL2 unit 332 (also referred to herein as upstream module), Z cache 334, pixel shader (PS) unit 340, texture (T) cache 342, ZL3 unit 344 (also referred to herein as downstream module), destination (D) unit 346, and D cache 348. In some embodiments, functionality of one or more of these units, such as the D unit 346 and the D cache 348, may be combined, or re-arranged in different order in the pipeline.

The BCI unit 320 receives data and commands (the latter from software driver 250) via the bus interface unit (BIU) 218 and memory interface unit (MIU) 210, and responsively initializes the processing of the vertex data. In one embodiment, the BIU 218 and MIU 210 are configured to send data and receive data according to the PCIE protocol and double data rate (DDR) memory protocol. The ZL1 and D caches 330 and 348, respectively, interface with the MIU 210 and BIU 218 (e.g., to perform read and write operations). The D unit 346 is coupled to the PS unit 340 and ZL3 unit (downstream module) 344, and is responsible for color functionality (e.g., dither, fog, alpha blend, etc.), as is known, and further accesses the D cache 348. The PS unit 340 accesses the T cache 342, which corresponds to texture processing according to well-known texture fetch and filter mechanisms.

In operation, the BCI 320 receives a command from an application driver 250 or other software (not shown) to draw a triangle. The BCI 320 also receives vertex information corresponding to the triangle to be drawn. The vertex information is passed to the VS 322, where vertex transformations are implemented. In particular, objects are transformed from object space to work space and screen space as triangles. The triangles are passed to the TSU 324, which assembles primitives, and also performs well-known tasks such as bounding box generation, culling, edge function generation, and triangle level rejections, among other well-known functions. The TSU 324 passes data to the STG 326, which provides tile generation functionality whereby the data objects are segmented into tiles (e.g., 8×8, 16×16, etc.) and passed to the ZL1 unit 328.

The ZL1 unit 328, like the ZL2 and ZL3 units 332, 344, respectively, performs Z-value processing, such as high level rejection of Z-values (e.g., where fewer bits are consumed than similar processing at a lower level). In general, the ZL2 unit (upstream module) 332 and the ZL3 unit (downstream module) 344 comprise logic to perform well-known graphics processing functionality, such as implementing Z-comparisons and stencil tests. Additionally, the ZL3 unit (downstream module) 344 comprises logic for performing alpha-testing. The ZL units 328, 332, and 344 operate in conjunction with the ZL1 cache 330, Z cache 334, and Z cache 334, respectively. For instance, the ZL2 unit (upstream module) 332 and the ZL3 unit (downstream module) 344 access the Z cache 334.

The PS unit 340 comprises a programmable unit that receives texture and pipelined data and provides outputs to the D unit 346 and ZL3 unit (downstream module) 344. The D unit 346 and ZL3 unit (downstream module) 344 are configured to perform alpha testing and stencil testing before values in the Z cache 334 or D cache 348 need to be updated. In certain implementations, Z rejection is performed before the T cache 342 and the PS unit 340, enabling a reduction in unused texture fetches and PS execution for a multitude of Z tiles, as well as enabling a savings in memory traffic and PS utilization. The ZL3 unit (downstream module) 344 enables performance of Z testing after the PS unit 340, such as in instances where alpha testing is enabled and the ZL1 unit 328 is implemented in a conservative manner.

Various commands are passed from the driver software 250 through the pipeline (e.g., through BCI 320, VS 322, etc.), with commands specific to a particular unit being received in the respective register of that unit. For instance, portions of a command pair specific to the ZL2 unit (upstream module) 332 and the ZL3 unit (downstream module) 344 are received at registers in the ZL2 and ZL3 units, respectively. One portion of the command pair (a wait command) is received in a register of the ZL2 unit (upstream module) 332, and the other portion (a signal command) of the command pair passes through the ZL2 unit (upstream module) 332 and is received in a register of the ZL3 unit (downstream module) 344. The command pair has matching identifiers. The ZL3 unit (downstream module) 344 provides the identifier portion of the signal command back to the ZL2 unit (upstream module) 332 via direct connection 350 for comparison as explained below.

Figure 4:
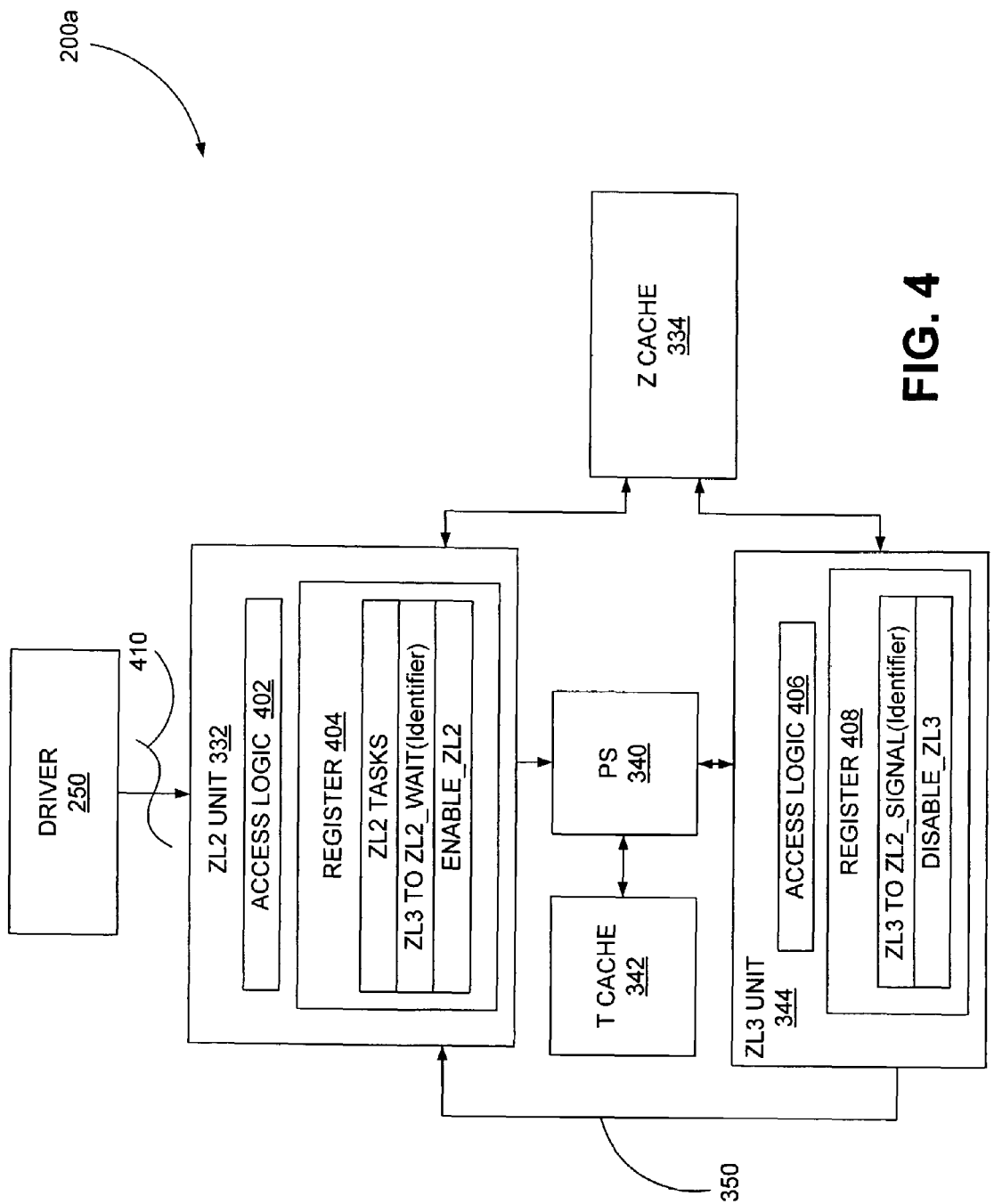
FIG. 4 is a block diagram that illustrates select components of an embodiment of a shared memory synchronization system as shown in FIG. 3.

FIG. 4 is a block diagram that illustrates an embodiment of the synch system 200a shown in FIG. 3. Note that some embodiments of the synch system 200a can employ more, fewer, or different components than those shown in FIG. 4. For instance, in some embodiments, the synch system 200a may not include the driver 250, the T cache 324, etc., or in some embodiments, the synch system 200a may comprise most if not all of the components of the GPU 214 or graphics processor system 100. The synch system embodiment 200a shown in FIG. 4 comprises the driver software 250, the ZL2 unit (upstream module) 332, the PS unit 340 coupled between the ZL2 unit (upstream module) 332 and the ZL3 unit (downstream module) 344, a T cache unit 342 coupled to the PS unit 340, the Z cache 334 that has one or more locations shared by the ZL2 unit (upstream module) 332 and ZL3 unit (downstream module) 344, and a direct connection 350 that enables the transfer of command identifier(s) from the ZL3 unit (downstream module) 334 to the ZL2 (upstream module) 332. A curved line 410 is shown between the ZL2 unit (upstream module) 332 and the driver software 250 to represent that the driver software provides commands to one or more processing units located upstream in the pipeline with respect to the ZL2 unit (upstream module) 332.

In addition to the above-mentioned functionality, the ZL2 unit (upstream module) 332 comprises access logic 402, explained below, and one or more registers, such as register 404. Likewise, the ZL3 unit (downstream module) 344 comprises access logic 406, explained below, and one or more registers 408. The other modules, such as Z cache 334, also comprise registers not shown. The driver software 250 provides various commands to the register 404 for temporary storage, including ZL2 tasks to be performed by the ZL2 unit (upstream module) 332, an Enable_ZL2 command, and one portion of the paired commands comprising a ZL3 to ZL2_WAIT (identifier) command. A ZL3 to ZL2_SIGNAL (identifier) and a Disable_ZL3 command is passed along the pipeline to register 408 of the ZL3 unit (downstream module) 344. The identifier can be in the form of a token, such as a 32-bit value, that is incremented by the driver software 250 activating a counter (not shown) at each instance control transfers from the ZL3 unit (downstream module) 344 to the ZL2 unit (upstream module) 332. The ZL2 unit (upstream module) 332 and ZL3 unit (downstream module) 344 may be switched (i.e., transfer of control) when render states change through the use of the Disable_ZL3 and the Enable_ZL2 command.

The ZL2 unit (upstream module) 332 and ZL3 unit (downstream module) 344 share registers in the Z cache 334, and thus require synchronization to avoid RAW hazard. Only one active device, either the ZL2 unit (upstream module) 332 or the ZL3 unit (downstream module) 344, accesses (e.g., changes values) one or more registers of the Z cache 334, although both devices may accept commands into their respective registers 404 and 408 at any time. When control transfers from the ZL2 unit (upstream module) 332 to the ZL3 unit (downstream module) 344, the properties of pipeline architectures in general guarantee that a module situated later in a pipeline (e.g., the ZL3 unit (downstream module) 344) receives any task after a module located relatively earlier in the pipeline (e.g., the ZL2 unit (upstream module) 332) becomes idle, and thus synchronization mechanisms are generally unwarranted for such control transfers. Note that some embodiments may nevertheless include synchronization mechanisms when control transfers from the ZL2 unit (upstream module) 332 to the ZL3 unit (downstream module) 344.

In operation, the Disable_ZL3 and Enable_ZL2 commands are received in the registers 404 and 408, respectively, to activate and disable the ZL2 unit (upstream module) 332 and ZL3 unit (downstream module) 344, respectively. Paired commands comprising ZL3 to ZL2_WAIT (identifier) and ZL3 to ZL2_SIGNAL (identifier) are also sent at a time corresponding to the delivery of the Disable_ZL3 and Enable_ZL2 commands. The ZL3 to ZL2_WAIT (identifier) and ZL3 to ZL2_SIGNAL (identifier) commands are received in the registers 404 and 408, respectively. As described previously, these two commands are in a pair and require the same identifier. The identifier can be managed by the driver software 250 to distinguish from other switches (e.g., corresponding to other rendering states) implemented in the control sequence of the pipeline. As explained above, one mechanism for maintaining the identifier is to increase a counter whenever a ZL3 to ZL2 switch occurs. The identifier can be wrapped around (i.e., counter value wrap-around) if it has already reached its design size (e.g., 32 bits wide). As indicated above, there is no need to count ZL2 to ZL3 switches because there is no need to have internal synchronization to perform the switch.

When the ZL2 unit (upstream module) 332 receives the ZL3 to ZL2_WAIT (identifier) command, the access logic 402 compares the identifier in the ZL3 to ZL2_WAIT (identifier) command stored in register 404 with an identifier or identifier copy returned from the access logic 406 (of the ZL3 unit (downstream module) 344). Since the ZL3 to ZL2_SIGNAL (identifier) command is simply passed down the pipeline from the ZL2 unit (upstream module) 332, it is possible that an identifier (e.g., corresponding to a key for another rendering state) returned by the access logic 406 of the ZL3 unit (downstream module) 344 is less (in value or count) than the identifier in the ZL2_WAIT (identifier) command. Accordingly, the access logic 402 of the ZL2 unit (upstream module) 332 blocks (e.g., prohibits Z cache access and register changes) any further ZL2 requests and keeps waiting for an identifier returned from the access logic 406 of the ZL3 unit (downstream module) 344 to equal the current identifier in the ZL3 to ZL2_WAIT (identifier) command. In this waiting period, no access to the Z cache 334 is allowed by the access logic 402 of the ZL2 unit (upstream module) 332, which guarantees that the ZL2 unit (upstream module) 332 will not access unstable data from the Z cache 334. Also during this waiting period, the ZL3 to ZL2_SIGNAL (identifier) command of the command pair continues to move along the pipeline and eventually reaches the register 408 of the ZL3 unit (downstream module) 344.

Although the ZL3 unit (downstream module) 344 may have received the Disable_ZL3 and/or ZL3 to ZL2_SIGNAL (identifier) command into its register 408, the ZL3 unit (downstream module) 344 continues to process the current ZL3 tasks until all the tiles are completed and Z data is written by the access logic 406 into the Z cache 334. Once the data is written, the ZL3 unit (downstream module) 344 enters an idle state where no further access to the Z cache 334 occurs until the ZL3 unit (downstream module) 344 is enabled (e.g., through an enable command from the driver software 250). At a time corresponding to this idle state, the access logic 406 of the ZL3 unit (downstream module) 344 parses the identifier (or copy thereof) in the ZL3 to ZL2_SIGNAL (identifier) command stored in register 408, and provides the same back to the register 404 of the ZL2 unit (upstream module) 332 via direct connection 350. Since the ZL3 to ZL2_SIGNAL (identifier) command is pipelined with all of the ZL3 tasks, the identifier is generally provided over connection 350 immediately after the ZL3 unit (downstream module) 344 enters an idle state.

The access logic 402 of the ZL2 unit (upstream module) 332 compares the identifier as part of its maintenance of a loop to check the matching of identifiers. Immediately after the access logic 402 detects a match, the access logic 402 (and the rest of the ZL2 unit (upstream module) 332) ceases the wait loop, and the ZL2 unit (upstream module) 332 commences processing of entries received after the ZL3 to ZL2_WAIT command is received in register 404. In other words, ZL2 processing is resumed and the above-described ZL3 to ZL2 switch cycle is complete.

Note that although various functionality has been attributed to access logic 402 and 406 as described above, one skilled in the art would understand that such logic functions can be further combined as functionality integrated with, or separate from, standard Z-processing functionality, resulting in fewer components in some embodiments or distributed among additional components in some embodiments.

Figure 5:
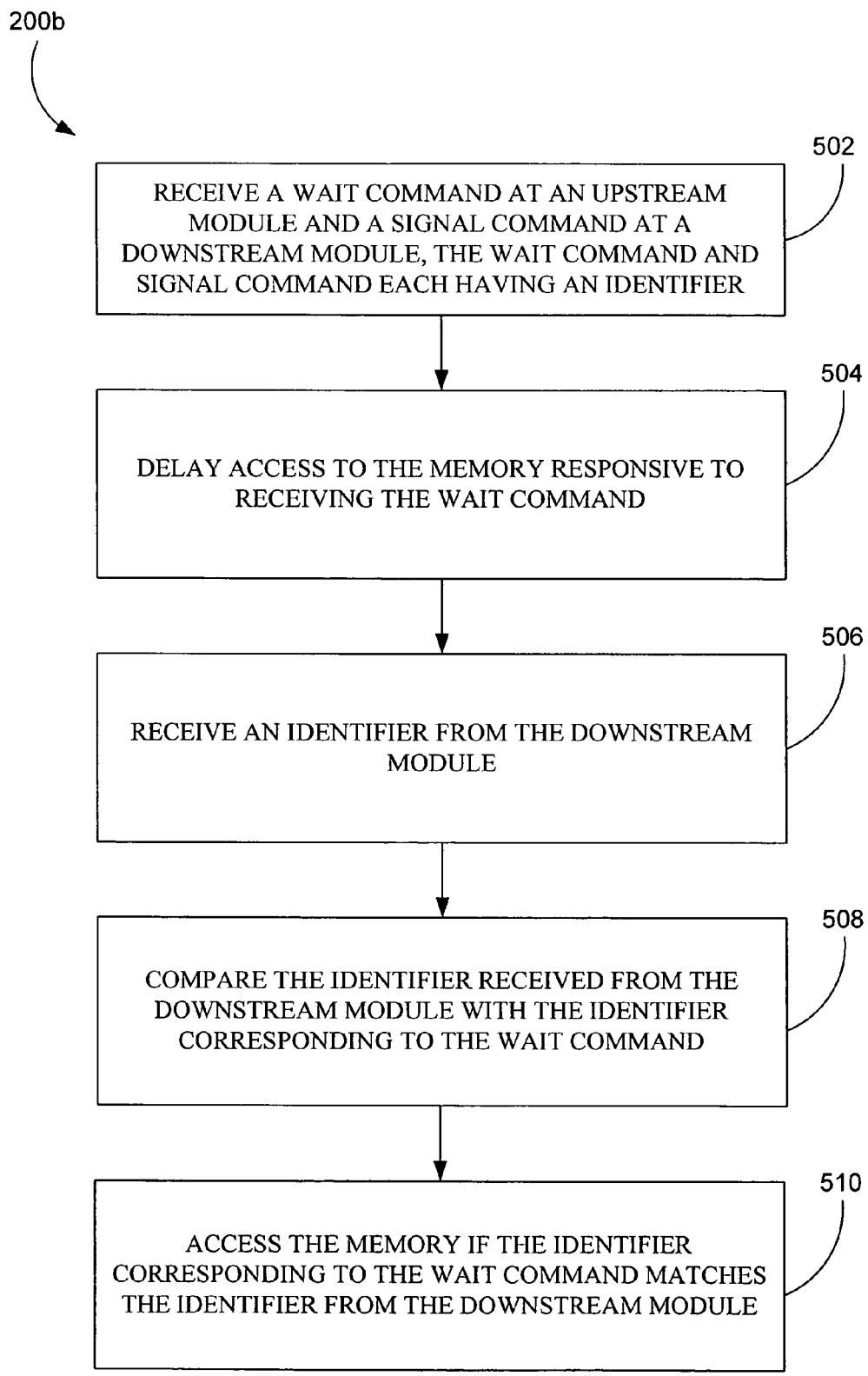
FIG. 5 is a flow diagram that illustrates an embodiment of a method of synchronizing access to a shared memory between an upstream module and a module located downstream in the system shown in FIG. 4.

In view of the above description, it will be appreciated that one embodiment of a method 200b of synchronizing access to cache (or memory) between an upstream module and a module located downstream in a pipelined system, as shown in FIG. 5, may comprise receiving a wait command at the upstream module and a signal command at the downstream module, the wait command and signal command each having an identifier (502), delaying access to the memory responsive to receiving the wait command (504), receiving an identifier from a downstream module (506), comparing the identifier received from the downstream module with the identifier corresponding to the wait command (508), and accessing the memory if the identifier corresponding to the wait command matches the identifier from the downstream module (510).

Another method embodiment 200c, among others, can be viewed as a method of synchronizing access to cache (or memory) between a downstream module and a module located upstream in a pipelined system. Such a method 200c is illustrated in FIG. 6, and comprises receiving a signal command at the downstream module, the signal command having an identifier (602), writing data to the memory until an idle state is reached (604), and responsive to the idle state, providing the identifier to the upstream module (606).

Figure 6:
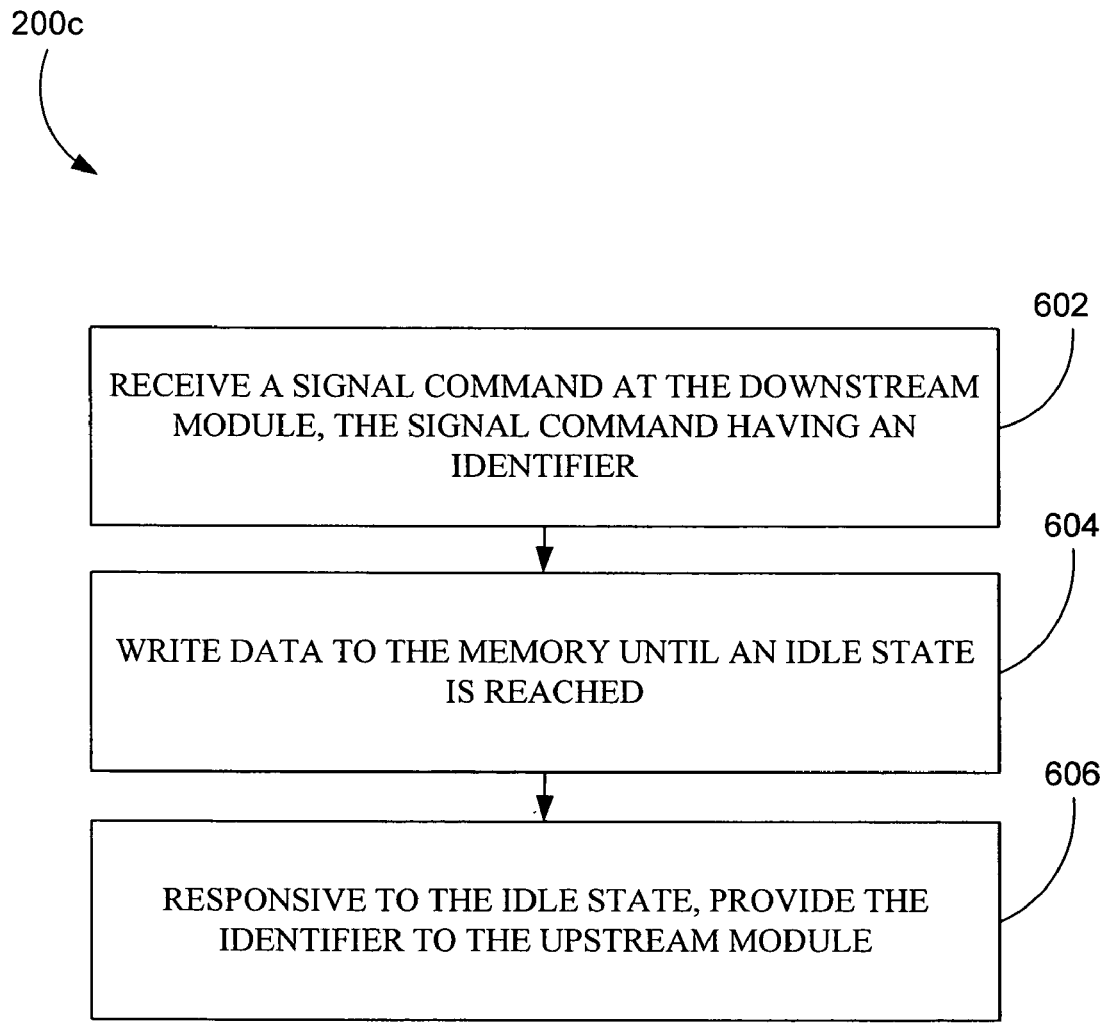
FIG. 6 is a flow diagram that illustrates an embodiment of a method of synchronizing access to a shared memory between a downstream module and a module located upstream in the system shown in FIG. 4.

The flow diagrams of FIGS. 5 and 6 show the architecture, functionality, and/or operation of a possible implementation of the synch system 200. In this regard, each block represents various functionality of one or more modules (e.g., upstream module 332, downstream module 344, etc.) as instructions or commands derived from the driver software 250 are executed. It should also be noted that in some alternative implementations, the functions noted in the blocks may occur out of the order noted in FIGS. 5 and 6. For example, two blocks shown in succession in FIGS. 5 and 6 may in fact be executed substantially concurrently or the blocks may sometimes be executed in the reverse order, depending upon the functionality involved, as will be further clarified hereinbelow.

It should be emphasized that the above-described embodiments of the present disclosure, particularly, any "preferred" embodiments, are merely possible examples of implementations, merely set forth for a clear understanding of the principles of the invention. Many variations and modifications may be made to the above-described embodiment(s) without departing substantially from the spirit and principles of the invention. All such modifications and variations are intended to be included herein within the scope of this disclosure.

What is claimed:

1. A method of synchronizing access to memory between an upstream module and a module located downstream in a pipelined system, comprising:
    receiving a wait command at the upstream module and a signal command at the downstream module, the wait command and the signal command each having an identifier;
    delaying access to the memory responsive to receiving the wait command;
    receiving an identifier from the downstream module;
    comparing the identifier received from the downstream module with the identifier corresponding to the wait command; and
    accessing the memory if the identifier corresponding to the wait command matches the identifier from the downstream module.

2. The method of claim 1, wherein accessing comprises accessing based on all commands received after the wait command.

3. The method of claim 1, wherein accessing comprises accessing a shared location in the memory, the location shared between the upstream module and the downstream module.

4. The method of claim 1, wherein delaying access comprises blocking access by the upstream module.

5. The method of claim 1, further comprising receiving an enabling command at the upstream module to activate the upstream module and a disabling command at the downstream module to deactivate the downstream module at a time corresponding to receiving the wait and signal command at the upstream and downstream modules, respectively.

6. The method of claim 1, wherein receiving the identifier from the downstream module comprises receiving the identifier over a direct connection between the upstream module and the downstream module.

7. A method of synchronizing access to memory between a downstream module and a module located upstream in a pipelined system, comprising:
    receiving a signal command at the downstream module, the signal command having an identifier;
    writing data to the memory until an idle state is reached; and
    responsive to the idle state, providing the identifier to the upstream module.

8. The method of claim 7, wherein writing the data to the memory comprises writing the data to a location in the memory that is shared with the upstream module.

9. The method of claim 7, further comprising receiving a disable command at the downstream module to prompt commencement of the idle state.

10. The method of claim 7, wherein providing the identifier comprises providing the identifier over a direct connection between the upstream module and the downstream module.

11. The method of claim 7, further comprising idling until an enabling command is received.

12. The method of claim 11, further comprising ceasing access to the memory during the idling.

13. A system that synchronizes access to memory between a plurality of modules in a pipelined system, comprising:
    an upstream module comprising:
    a first register configured to receive a wait command having an identifier; and
    a first access logic configured to delay access to the memory responsive to receiving the wait command at the first register, receive an identifier from a downstream module, compare the identifier received from the downstream module with the identifier corresponding to the wait command, and access the memory if the identifier corresponding to the wait command matches the identifier from the downstream module.

14. The system of claim 13, wherein the first access logic comprises at least one of a discrete logic circuit having logic gates for implementing logic functions upon data signals, an application specific integrated circuit (ASIC) having appropriate combinational logic gates, a programmable gate array(s) (PGA), and a field programmable gate array (FPGA).

15. The system of claim 13, further comprising the downstream module that is directly connected to the upstream module.

16. The system of claim 13, further comprising a driver software communicatively coupled to the upstream module and configured to provide the wait command to the first register.

17. A system that synchronizes access to memory between a plurality of modules in a pipelined system, comprising:
   a downstream module comprising:
      a second register configured to receive a signal command having an identifier; and
      a second access logic configured to write data to the memory until an idle state is reached, and responsive to the idle state, provide the identifier to an upstream module.

18. The system of claim 17, wherein the second access logic is configured to write data to a location in the memory that is shared with the upstream module.

19. The system of claim 17, wherein the second access logic is configured to provide the identifier over a direct connection between the upstream module and the downstream module.

20. The system of claim 17, wherein the second access logic is configured to maintain an idle state until an enabling command is received.

21. The system of claim 20, wherein the second access logic is configured to cease access to the memory during the idle state.

22. The system of claim 17, wherein the second access logic comprises at least one of a discrete logic circuit having logic gates for implementing logic functions upon data signals, an application specific integrated circuit (ASIC) having appropriate combinational logic gates, a programmable gate array(s) (PGA), and a field programmable gate array (FPGA).

23. The system of claim 17, further comprising the upstream module that is directly connected to the downstream module.

24. The system of claim 17, further comprising a driver software communicatively coupled to the downstream module and configured to provide the signal command to the second register.

25. A graphics processing unit, comprising:
   an upstream module and a downstream module connected to the upstream module, the upstream module comprising:
      a first register configured to receive a wait command having an identifier; and
      a first access logic configured to delay access to a memory responsive to receiving the wait command at the first register, receive an identifier from the downstream module, compare the identifier received from the downstream module with the identifier corresponding to the wait command, and access the memory if the identifier corresponding to the wait command matches the identifier from the downstream module; and
   the downstream module comprising:
      a second register configured to receive a signal command having an identifier; and
      a second access logic configured to write data to the memory until an idle state is reached, and responsive to the idle state, provide the identifier corresponding to the signal command to the upstream module.

26. The graphics processing unit of claim 25, wherein the upstream module and the downstream module each comprise a Z-processing unit.

27. The graphics processing unit of claim 25, wherein the memory comprises a Z-cache unit.

* * * * *